(12) United States Patent
Om (10) Patent No.: US 7,595,239 B2
(45) Date of Patent: Sep. 29, 2009

(54) METHOD OF FABRICATING FLASH MEMORY DEVICE

(75) Inventor: Jae Chul Om, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 169 days.

(21) Appl. No.: 11/380,416

(22) Filed: Apr. 26, 2006

(65) Prior Publication Data

US 2007/0254433 A1    Nov. 1, 2007

(30) Foreign Application Priority Data

Apr. 28, 2005    (KR) .................... 10-2005-0035699

(51) Int. Cl.
*H01L 21/336* (2006.01)
(52) U.S. Cl. ............................. 438/263; 257/E21.681; 257/E21.682
(58) Field of Classification Search ................ 438/257, 438/294, 259, 263; 257/330, 331, E21.681, 257/E21.682
See application file for complete search history.

(56) References Cited

U.S. PATENT DOCUMENTS

| | | | |
|---|---|---|---|
| 5,021,848 A * | 6/1991 | Chiu | ........................... 257/317 |
| 5,392,237 A | 2/1995 | Iida | |
| 6,204,122 B1 | 3/2001 | Joo et al. | |
| 6,548,353 B2 | 4/2003 | Tseng | |

| | | | |
|---|---|---|---|
| 2004/0214394 A1 | 10/2004 | Shimizu | |
| 2004/0238881 A1 | 12/2004 | Ozawa | |

FOREIGN PATENT DOCUMENTS

| | | |
|---|---|---|
| JP | 10-173076 | 6/1998 |
| JP | 2002-057228 | 2/2002 |
| KR | 101998048384 | 9/1998 |
| KR | 1020010061409 A | 7/2001 |
| KR | 1020010084627 A | 9/2001 |
| KR | 1020020014274 A | 2/2002 |

* cited by examiner

*Primary Examiner*—Walter L Lindsay, Jr.
*Assistant Examiner*—Vicki B Booker
(74) *Attorney, Agent, or Firm*—Townsend and Townsend and Crew LLP (57) ABSTRACT

A method of fabricating a non-volatile memory device forming a first polysilicon film over a semiconductor substrate; forming a mitigation film over the first polysilicon film; forming a mask film over the mitigation film; etching the mask film, the mitigation film, and the first polysilicon film to form a first trench that defines first and second floating gates; forming an interlayer film over the mask film, the interlayer film filling the first trench to form a vertical structure; anisotropically etching the vertical structure of the interlayer film to form second and third trenches, the second trench being provided between the first floating gate and the etched vertical structure, the third trench being provided between the second floating gate the and etched vertical structure; forming a dielectric film over the first and second floating gate and the vertical structure, the dielectric film coating sidewalls of the second and third trenches; and forming a control gate layer over the dielectric film, the control gate layer filling the first and second trenches.

4 Claims, 7 Drawing Sheets

METHOD OF FABRICATING FLASH MEMORY DEVICE

BACKGROUND

The present invention relates to a method of fabricating flash memory devices. More particularly, the present invention relates to a method of fabricating flash memory devices in which the interference between adjacent cells can be prevented.

As flash memory devices get smaller, the distance between cells is narrowed and coupling capacitance between cells is increased.

An increase in such coupling capacitance means an increase in the interference between adjacent cells. It means that a threshold voltage after programming and erasing a specific cell is varied according to the operation of adjacent cells.

Such interference causes an increase in the distribution of a threshold voltage. It also generates error in the cell operation, such as program disturb, pass disturb and read disturb.

An increase in the distribution of the threshold voltage due to the interference makes it difficult to fabricate a Multi-Level Cell (MLC) requiring a small threshold voltage distribution in comparison with a Single Level Cell (SLC).

SUMMARY OF THE INVENTION

An embodiment of the present invention relates to a method of fabricating flash memory devices in which the interference between cells can be reduced.

Another embodiment of the present invention relates to a method of fabricating flash memory devices in which an increase in the distribution of a threshold voltage can be prevented.

Still another embodiment of the present invention relates to a method of fabricating flash memory devices in which error in the cell operation can be prevented.

Further another embodiment of the present invention relates to a method of fabricating flash memory devices in which the fabrication of a MLC can be facilitated.

A method of fabricating a flash memory device according to an embodiment of the present invention includes the steps of forming polysilicon films for a floating gate on a semiconductor substrate, the polysilicon films have a stripe form and are aligned in one direction with a tunnel oxide film therebetween, sequentially forming a mitigation film and a mask film on the entire surface, patterning the mask film, the mitigation film and the polysilicon films for the floating gate in the other direction vertical to the one direction, thereby forming floating gates having an island shape and causing the mitigation film and the mask film to remain in stripe patterns aligned in the other direction, forming an interlayer insulating film between the stripe patterns including the mitigation film and the mask film, stripping the mask film to expose lateral portions of the interlayer insulating film, recessing the lateral portions of the exposed interlayer insulating film and stripping the mitigation film, reducing a groove of the interlayer insulating film and forming a groove between the interlayer insulating film and the floating gate, and forming an interlayer dielectric film on the entire surface and forming a control gate in the floating gate and the interlayer insulating film in a self-aligned manner.

In one embodiment, a method of fabricating a flash memory device includes forming first and second polysilicon films over a semiconductor substrate, the first and second polysilicon films have a stripe form and are aligned in a first direction; sequentially forming a mitigation film and a mask film; patterning the mask film, the mitigation film and the first and second polysilicon films in a second direction, thereby forming floating gates having an island shape and causing the mitigation film and the mask film to remain in stripe patterns aligned in the second direction; forming an interlayer insulating film over the mitigation film and the mask film, the interlayer insulating film having vertical structures that extend between the stripe patterns including the mitigation film and the mask film; removing the mask film to expose upper portions of the vertical structures of the interlayer insulating film; etching the upper portions of the vertical structures of the exposed interlayer insulating film; anisotropically etching the vertical structures of the interlayer insulating film to form trenches that separate the vertical structures from the floating gates, so that each vertical structure is associated with first and second trenches that separate the vertical structure from the adjacent floating gates; forming an interlayer dielectric film over the floating gates and the vertical structures, the interlayer dielectric film extending into the trenches and coating sidewalls of the trenches; and forming a control gate layer over the interlayer dielectric film, the control gate layer filling the trenches.

In another embodiment, a method of fabricating a non-volatile memory device forming a first polysilicon film over a semiconductor substrate; forming a mitigation film over the first polysilicon film; forming a mask film over the mitigation film; etching the mask film, the mitigation film, and the first polysilicon film to form a first trench that defines first and second floating gates; forming an interlayer film over the mask film, the interlayer film filling the first trench to form a vertical structure; anisotropically etching the vertical structure of the interlayer film to form second and third trenches, the second trench being provided between the first floating gate and the etched vertical structure, the third trench being provided between the second floating gate the and etched vertical structure; forming a dielectric film over the first and second floating gate and the vertical structure, the dielectric film coating sidewalls of the second and third trenches; and forming a control gate layer over the dielectric film, the control gate layer filling the first and second trenches.

The method further comprises removing the mask film to expose an upper portion of the vertical structure; and etching the upper portion of the vertical structure of the exposed insulating film to reduce the width of the upper portion, so that the vertical structure is provided with first and second profiles, wherein the second and third trenches are formed by etching the first and second profiles, respectively.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

In the following detailed description, only certain exemplary embodiments of the present invention have been shown and described simply by way of illustration. As those skilled in the art will realize, the described embodiments may be modified in various different ways, all without departing from the spirit or scope of the present invention. Accordingly, the drawings and description are to be regarded as illustrative in nature and not restrictive. Like reference numerals designate like elements.

FIGS. 1A to 1F are plan views illustrating a method of fabricating a flash memory device according to an embodiment of the present invention. FIGS. 2A to 2I are cross-sectional views of the flash memory devices in a Y-Y direction of FIGS. 1A to 1F. FIGS. 3A to 3C are cross-sectional views of the flash memory devices in an X-X direction of FIGS. 1A, 1B and 1F.

Figure 1A:
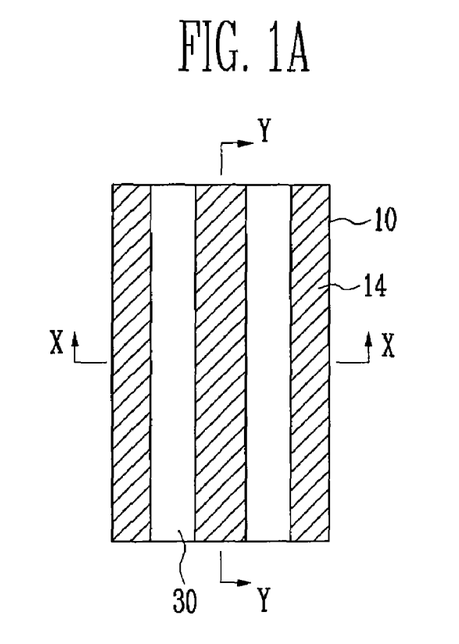
FIGS. 1A to 1F are plan views illustrating a method of fabricating a flash memory device according to an embodiment of the present invention.
Figure 2A:
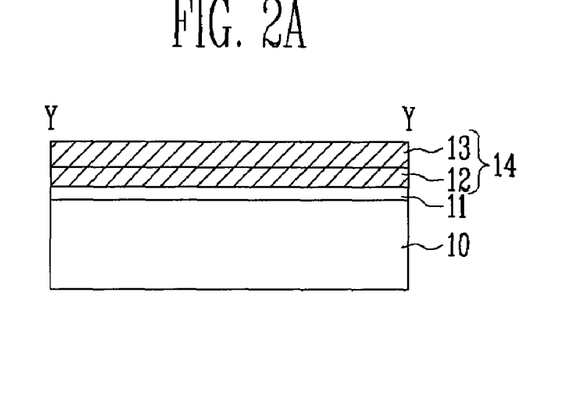
FIGS. 2A to 2I are cross-sectional views of the flash memory devices in a Y-Y direction of FIGS. 1A to 1F.
Figure 3A:
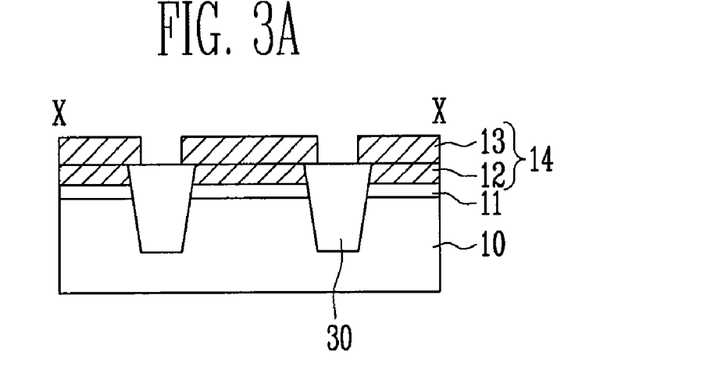
FIGS. 3A to 3C are cross-sectional views of the flash memory devices in an X-X direction of FIGS. 1A, 1B and 1F.
Figure 3B:
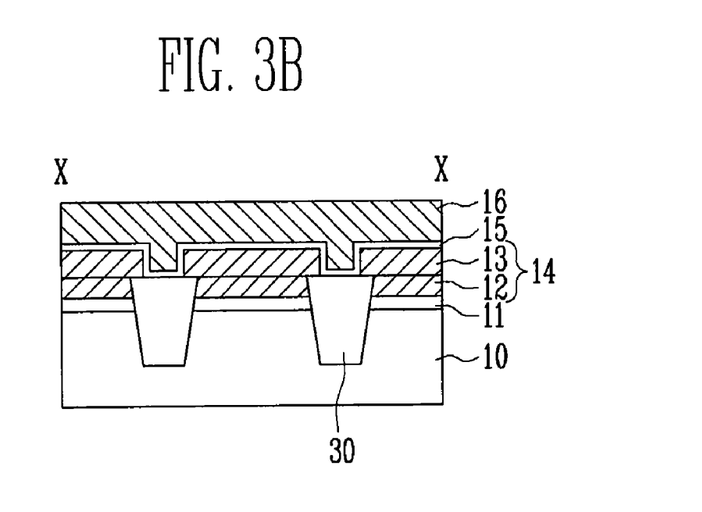
Figure 3C:
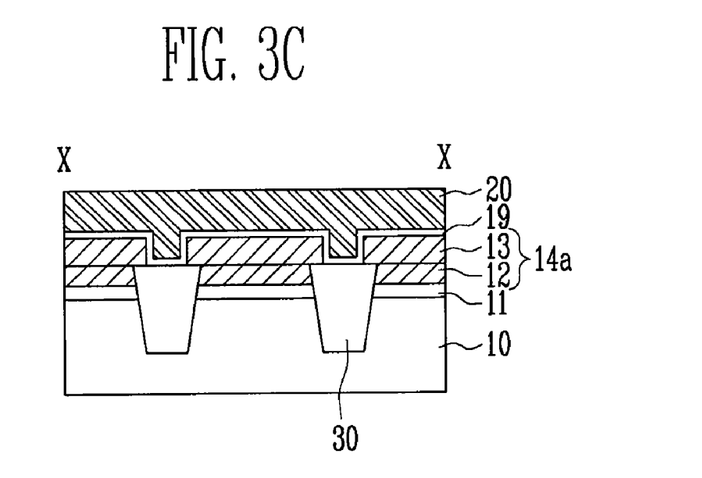

To fabricate a flash memory device according to an embodiment of the present invention, a tunnel oxide film 11, a first polysilicon film 12 and a hard mask film (not shown) are first formed on a semiconductor substrate 10 as shown in FIGS. 1A 2A and 3A. The hard mask film is patterned by a photolithography process so that a field region is defined. The first polysilicon film 12, the tunnel oxide film 11 and the semiconductor substrate 10 are etched using the patterned hard mask film as an etch mask, thereby forming trenches.

Thereafter, the hard mask film is stripped. The trenches are respectively buried with insulating films to form isolation films 30, so that the semiconductor substrate 10 is divided into an active region and the field region.

A second polysilicon film 13 is then formed on the entire surface. The first polysilicon film 12 and the second polysilicon film 13 are patterned using a photolithography process so that the second polysilicon films 13 remain on regions adjacent to the first polysilicon films 12.

As a result, the isolation films 30 are aligned in stripe form in a Y-direction as shown in FIG. 1A. A polysilicon layer or stack 14 has the first polysilicon film 12 and the second polysilicon film 13, and is formed on the active regions between the isolation films 30. The polysilicon layer 14 is used to define a floating gate subsequently. Edge portions of the polysilicon layer 14 overlaps with those of the isolation films 30.

Figure 1B:
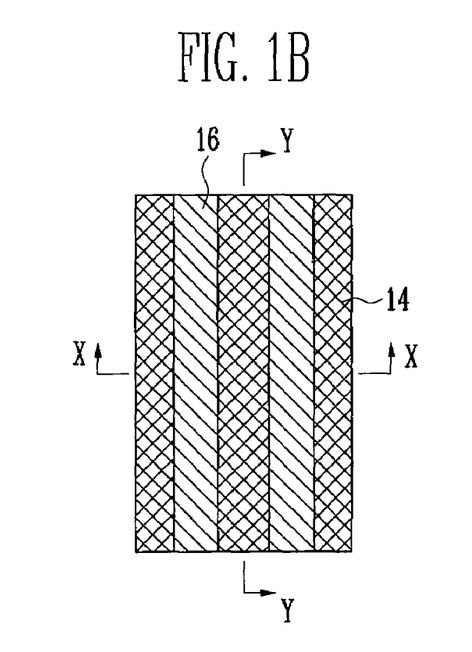
Figure 2B:
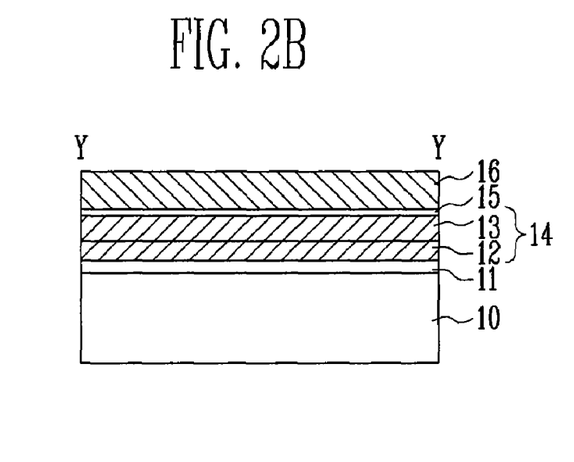

As shown in FIGS. 1B, 2B and 3B, an oxide film of 500 Å in thickness is deposited on the entire surface, thereby forming a mitigation film 15. A mask film 16 is formed on the mitigation film 15.

The mask film 16 is an insulating film, such as a nitride film or an oxynitride film, which has the etching selectivity of 1 or higher with respect to an interlayer insulating film that is to be formed later.

Figure 1C:
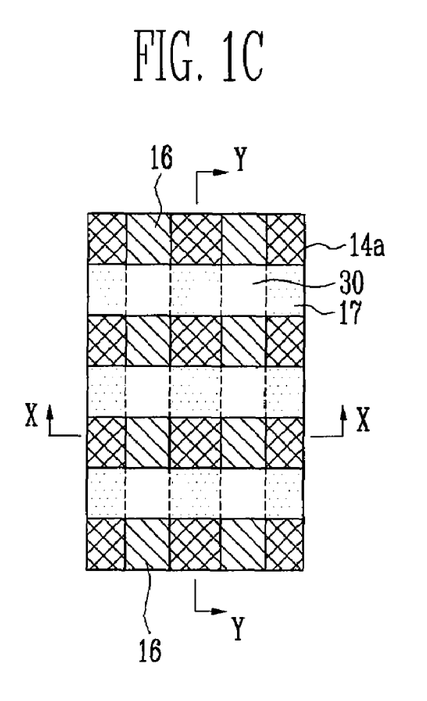
Figure 2C:
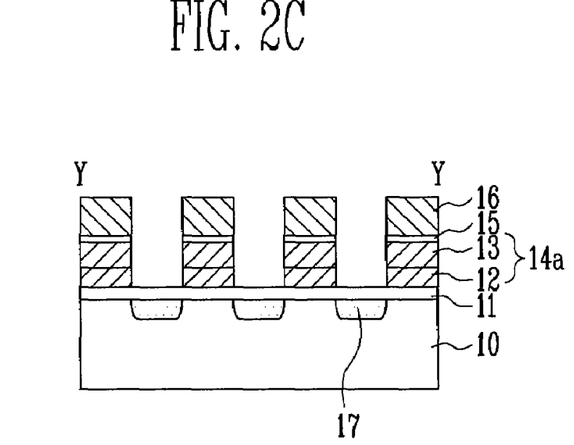

As shown in FIGS. 1C and 2C, the mask film 16 is formed by a photolithography process so that it remains in a stripe form in an X-direction orthogonal to the Y-direction.

The mitigation film 15 and the polysilicon layer 14 are then etched using the patterned mask film 16 as an etch mask, forming a floating gate 14a having an island shape. The mitigation film 15 and the mask film 16, which are aligned in stripe patterns in the X-direction, are formed on the semiconductor substrate 10 including the floating gate 14a.

Low-concentration (or lightly doped) source/drain ions are then formed using the mask film 16 as a mask, thus forming LDD junctions 17 in the semiconductor substrate 10 of the active region.

Figure 1D:
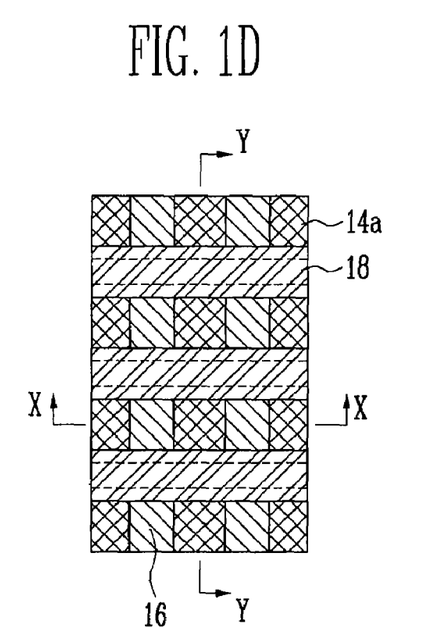
Figure 2D:
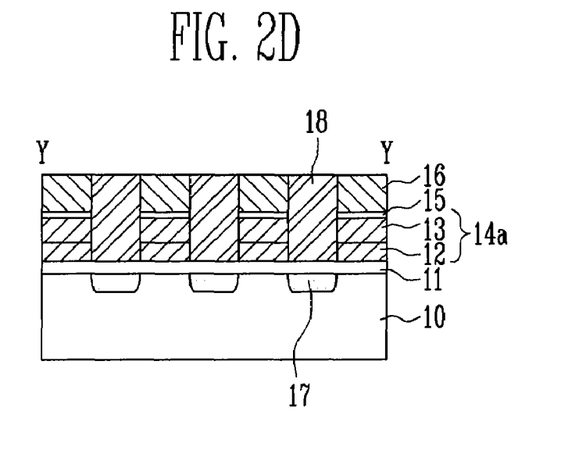

An oxide film is deposited on the entire structure to form an interlayer insulating film 18 as shown in FIGS. 1D and 2D. The entire surface undergoes Chemical Mechanical Polishing (CMP) so that the mask film 16 is exposed.

Figure 2E:
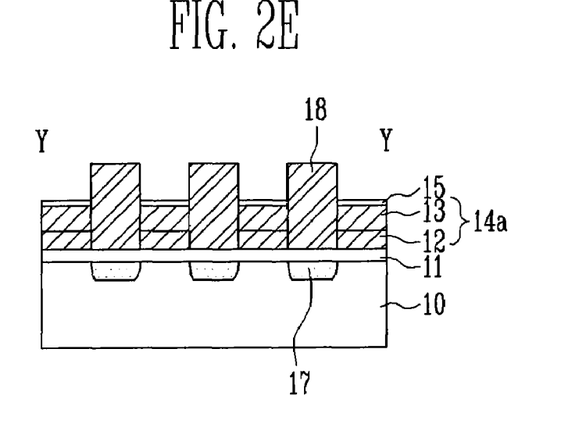

The mask film 16 is removed to expose upper portions of the interlayer insulating film 18 as shown in FIG. 2E. At this time, the mitigation film 15 and the interlayer insulating film 18 remain over the substrate due to a difference in the etching selectivity between the mask film 16 and the mitigation film 15 and between the mask film 16 and the interlayer insulating film 18.

Figure 2F:
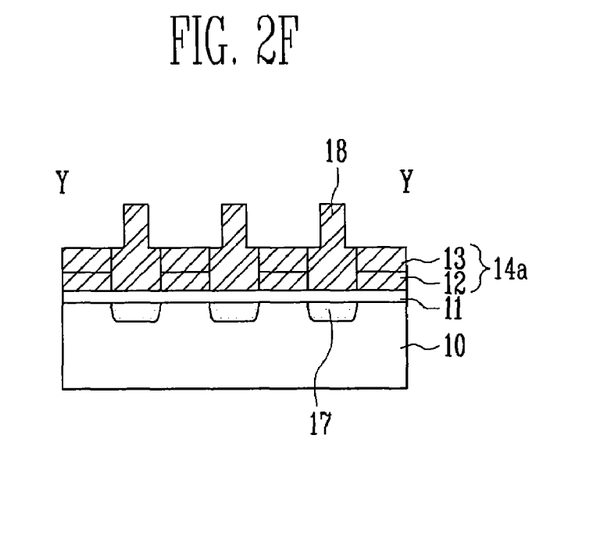

The exposed upper portions of the interlayer insulating film 18 are etch using an isotropic etch process as shown in FIG. 2F. The exposed upper portions are reduced in size and made thinner. The mitigation film 15 is stripped.

At this time, the floating gate 14a is substantially unaffected when the mitigation film 15 and the interlayer insulating film 18 are removed due to the difference in the etching selectivity between those films and the floating gate 14a.

Figure 1E:
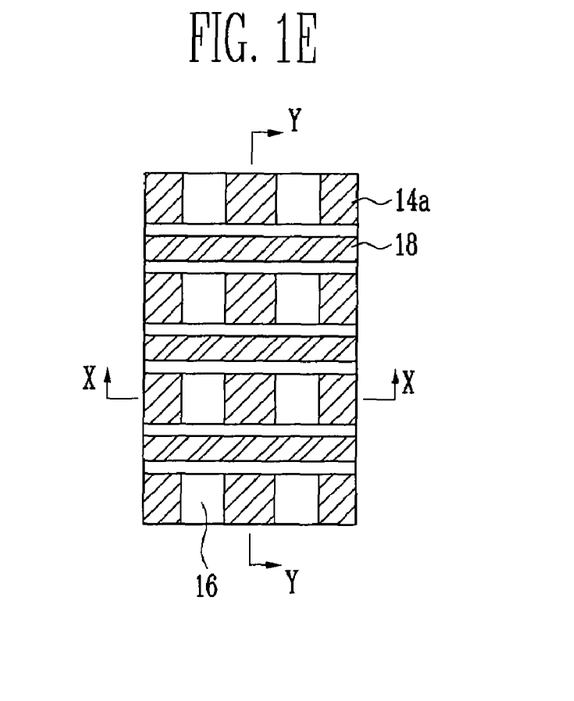
Figure 2G:
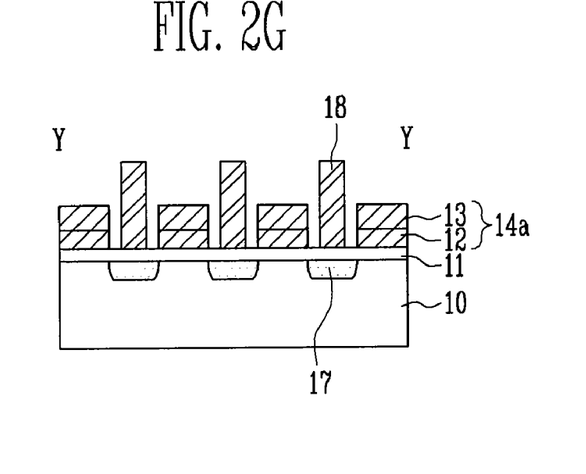

As shown in FIGS. 1E and 2G, the interlayer insulating film 18 is etched using an anisotropic etch process so that a groove is formed between the floating gate 14a and the interlayer insulating film 18.

Figure 2H:
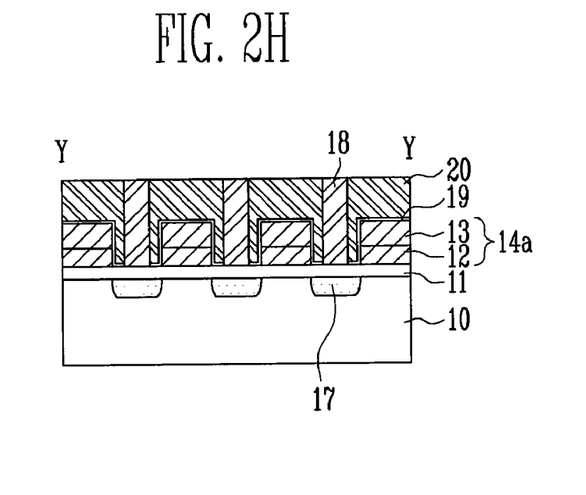

As shown in FIG. 2H, an interlayer dielectric film 19 is formed on the entire surface of the semiconductor substrate 10. A polysilicon film 20, which is to be used for a control gate, is then formed so that the floating gate 14a and the interlayer insulating film 18 are fully covered. At this time, the groove between the floating gate 14a and the interlayer insulating film 18 is completely filled by the polysilicon film 20.

The polysilicon film 20 is polished or removed using CMP so that the interlayer insulating film 18 is exposed. The polysilicon film 20 that has been polished becomes control gates. The polysilicon film/control gates 20 include portions that are self-aligned between the floating gate 14a and the interlayer insulating film 18.

The control gates 20 are separated from each other by the interlayer insulating film 18. Each control gate 20 has a number of strip patterns aligned in the X-direction. In addition, the control gate 20 completely (or substantially) surrounds a top surface and lateral portions of the floating gate 14a.

Thereafter, although not shown in the drawings, a silicide process using refractory metal, such as tungsten (W), cobalt (Co) or titanium (Ti), may be performed on the control gate 20 to reduce the electrical resistance of the control gate 20.

Figure 1F:
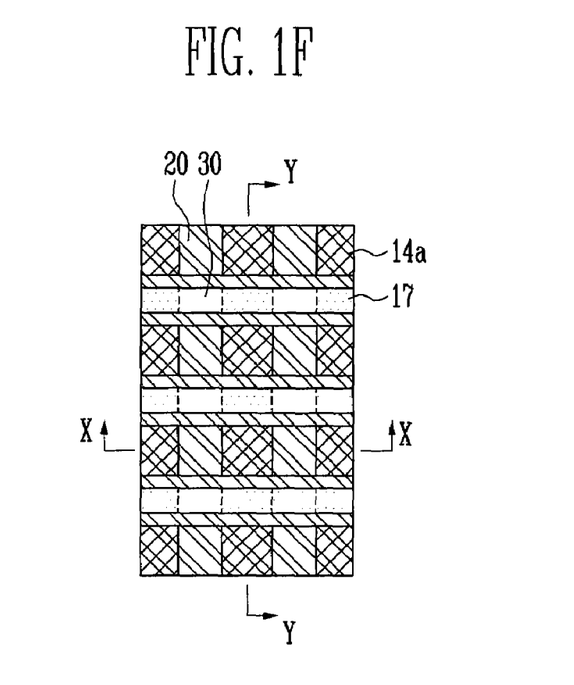
Figure 2I:
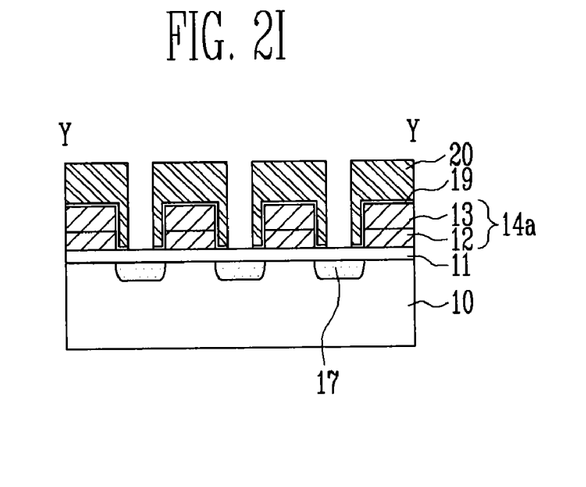

As shown in FIGS. 1F, 2I and 3C, the interlayer insulating film 18 is removed.

It has been described above that the embodiment is applied to a self-aligned Shallow Trench Isolation (STI) process. It is, however, to be understood that the embodiment may be applied to other types of processes such as a conventional STI process and a Self-Aligned Floating Gate (SA-FG) process.

As described above, the present invention has the following advantages.

First, since the control gate completely surrounds the lateral portions of the floating gate, the interference from an adjacent floating gate or control gate can be fundamentally prevented. Therefore, an increase in the distribution of a threshold voltage can be prevented and the stability in the operation of cells can be improved accordingly.

Second, since an increase in the distribution of a threshold voltage can be prevented, the fabrication of a MLC requiring a small distribution of a threshold voltage can be facilitated.

Third, since the control gate completely surrounds the lateral portions of the floating gate, an overlapping area between the floating gate and the control gate is increased. Accordingly, the coupling ratio can be enhanced.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of fabricating a non-volatile memory device, the method comprising:

forming stacked structures including a floating gate and a mask film over a semiconductor substrate;

forming interlayer films between the stacked structures;

removing the mask film;

etching the interlayer films to expose side walls of the interlaying films and the floating gate;

forming a dielectric film and a control gate layer over the floating gate and the semiconductor substrate between the interlayer films; and removing the interlayer films.

2. The method of claim 1, wherein the control gate layer substantially covers sidewalls of the floating gate.

3. The method of claim 1, further comprising:

etching exposed portions of the interlayer films to reduce a width of the exposed portions after removing the mask film.

4. The method of claim 1, wherein the floating gate comprises first and second polysilicon films.

* * * * *